United States Patent
Muccini et al.

(10) Patent No.: US 9,343,707 B2
(45) Date of Patent: May 17, 2016

(54) ELECTROLUMINESCENT ORGANIC DOUBLE GATE TRANSISTOR

(71) Applicant: E.T.C. S.R.L., Bologna (IT)

(72) Inventors: Michele Muccini, Bologna (IT); Raffaella Capelli, Bologna (IT)

(73) Assignee: E.T.C. S.R.L., Bologna (BO) (IT)

( * ) Notice: Subject to any disclaimer, the term of this patent is extended or adjusted under 35 U.S.C. 154(b) by 0 days.

(21) Appl. No.: 14/827,116

(22) Filed: Aug. 14, 2015

(65) Prior Publication Data

US 2015/0357604 A1 Dec. 10, 2015

Related U.S. Application Data

(63) Continuation of application No. 14/233,865, filed as application No. PCT/IB2012/053814 on Jul. 26, 2012, now abandoned.

(30) Foreign Application Priority Data

Jul. 29, 2011 (IT) .............................. MI2011A1445

(51) Int. Cl.
*H01L 51/52* (2006.01)
*H01L 51/05* (2006.01)

(52) U.S. Cl.
CPC ........ *H01L 51/5296* (2013.01); *H01L 51/0562* (2013.01)

(58) Field of Classification Search
CPC .................................................. H01L 51/5296
See application file for complete search history.

(56) References Cited

U.S. PATENT DOCUMENTS

| 2008/0173866 | A1* | 7/2008 | Kamikawa | H01L 51/0554 257/40 |
| 2012/0146003 | A1* | 6/2012 | Chang | H01L 29/4908 257/40 |

OTHER PUBLICATIONS

Notice of Abandonment for U.S. Appl. No. 14/233,865, filed Apr. 2, 2014 on behalf of Michele Muccini et al. 2 pages, Mail Date: Dec. 7, 2015.

* cited by examiner

*Primary Examiner* — Michael Jung
(74) *Attorney, Agent, or Firm* — Steinfl & Bruno LLP

(57) ABSTRACT

An organic electroluminescent transistor is described. The organic electroluminescent transistor has a first and a second dielectric layer, a first and a second control electrode and an assembly having a source electrode, a drain electrode and an ambipolar channel. The ambipolar channel has a first layer of semiconductor material, a second layer of semiconductor material and a layer of emissive material arranged between the first layer of semiconductor material and the second layer of semiconductor material. The source electrode and the drain electrode are both in contact with only one of the two layers of semiconductor material.

6 Claims, 3 Drawing Sheets

ELECTROLUMINESCENT ORGANIC DOUBLE GATE TRANSISTOR

CROSS REFERENCE TO RELATED APPLICATIONS

The present application is a Continuation of U.S. application Ser. No. 14/233,865 filed on Jan. 20, 2014, which is the U.S. National Stage of International Patent Application PCT/IB2012/053814 filed on Jul. 26, 2012 which, in turn, claims priority to Italian Patent Application MI2011A001445 filed on Jul. 29, 2011, the disclosures of all of which are incorporated herein by reference.

FIELD

The present invention relates to an electroluminescent organic double gate transistor and to a driving method of said transistor.

BACKGROUND

It is known from application WO2010/049871 a field effect transistor comprising two dielectric layers, two control or gate electrodes, and an assembly consisting of a source electrode or source, a drain electrode or drain, and an organic semiconductor in contact with said source and drain. Such an assembly is positioned between said two dielectric layers, each of which is positioned between said assembly and a control electrode. A light emitting transistor comprising such transistor is disclosed, wherein said organic semiconductor is an ambipolar organic semiconductor layer. The thickness of said semiconductor layer is necessarily limited to a few molecular layers, and preferably said thickness of the semiconductor layer is less than 10 nm, to allow the radiative recombination of electrons and holes, that were injected respectively from the source and drain and transported to the two interfaces of the semiconductor layer with the dielectric layers between which semiconductor said layer is arranged.

However, the emission properties of the light emitting transistor according to application WO2010/049871 are limited by intrinsic factors.

As a matter of fact, due to the above mentioned dimensional constraint on the maximum thickness of the semiconductor layer of the known transistor, the volume of semiconductor material in which the radiative recombination of the charges takes place is small and the intensity of light emission is consequently limited.

In addition, in the known transistor a single semiconductor layer is responsible for transport of both electrons and holes, thus limiting in practical applications the electrical performance of the device.

Moreover, the light emitting transistor according to application WO2010/049871 has a limited flexibility concerning the driving of the device.

It is also known from US2009/0008628 a field effect transistor comprising two dielectric layers, two control or gate electrodes, an assembly positioned between the two dielectric layers consisting of two transporting layers, an emissive layer positioned between the two transporting layers and source and drain electrodes, which are either both in contact with both conducting layers by interaction between the vertical surface of the contacts and the vertical surface of the conductive layers, or which have the vertical surface of one electrode (source or drain) in contact with the vertical surface of one conducting layer and the vertical surface of the other electrode (drain or source) in contact with the vertical surface of the other conducting layer.

The practical applications of the organic field effect transistors according to US2009/0008628 are affected by the transport layers/source and drain contacts geometry, which limits the efficiency of charge injection into the transport layers and therefore the overall electrical characteristics of the device. In addition, as a matter of fact, the practical realization of field effect transistors according to US2009/0008628 is unlikely to be realized with satisfactory quality and industrial reproducibility yields using standard manufacturing techniques. Bad contact points and shadow effects between the vertical surface of the conducting layers and the contacts are likely to be generated during the fabrication process, because the multilayer structure of US2009/0008628 requires a hole transporting layer, a light emitting layer, an electron transporting layer and a second insulating layer to be sequentially formed between the source electrode and the drain electrode in a direction parallel to these electrodes.

It is an objective of the present invention to provide an electroluminescent organic transistor which is free from said drawbacks. Said objective is achieved with an electroluminescent organic transistor whose main features are specified in the first claim and other features are specified in the remaining claims.

A first advantage of the electroluminescent organic transistor according to the present invention consists in its improved emission characteristics compared to the single layer transistors of the prior art. As a matter of fact, a material specifically dedicated to the emission of light, having an excellent efficiency in the generation of light, is provided in the ambipolar channel of the transistor according to the present invention.

In addition, the emissive layer in the channel of the electroluminescent organic transistor according to the present invention may have a larger thickness than the semiconductor layer in which the recombination occurs in the known single layer transistor, therefore the intensity of light emission in the device according to the present invention is higher compared to that of the known single layer transistor.

A further advantage of the electroluminescent organic transistor according to the present invention compared to that of the known single layer transistor consists in the fact that an optimization of the charge transport is allowed. As a matter of fact, thanks to the presence of two control electrodes and of an ambipolar channel comprising two semiconductor layers, each optimized for the transport of only one type of charge, the differences in the mobility of the charges and in the current density in said two semiconductor layers may be more effectively balanced by means of a suitable modulation of the potentials of the two control electrodes.

A further advantage of the electroluminescent organic transistor according to the present invention compared to that of the known trilayer transistor consists in the more effective charge injection into the active channel of the device, which leads to overall higher electronic and optoelectronic performances.

The electroluminescent transistor according to the present invention can be driven either in direct or reverse mode. In fact, in the device according to the present invention the charges can be transported not only at the interface between the semiconductor layers and dielectric layer, but also at the interface between the semiconductor layers and emissive layer, with a direct benefit on the emission efficiency and intensity

BRIEF DESCRIPTION OF THE DRAWINGS

Further advantages and features of the electroluminescent organic transistor according to the present invention will become apparent to those skilled in the art from the following detailed and not limiting description of an embodiment thereof with reference to the accompanying drawings in which.

DETAILED DESCRIPTION

The features of the drawings are not to scale, but their dimensions are enlarged or reduced in order to increase the clarity of the drawings.

Figure 1A:
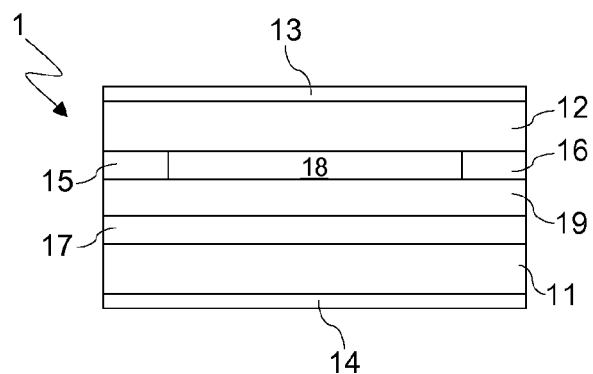
FIGS. 1a and 1b show the schematic sectional view in of the transistor according to two possible embodiments of the invention.
Figure 1B:
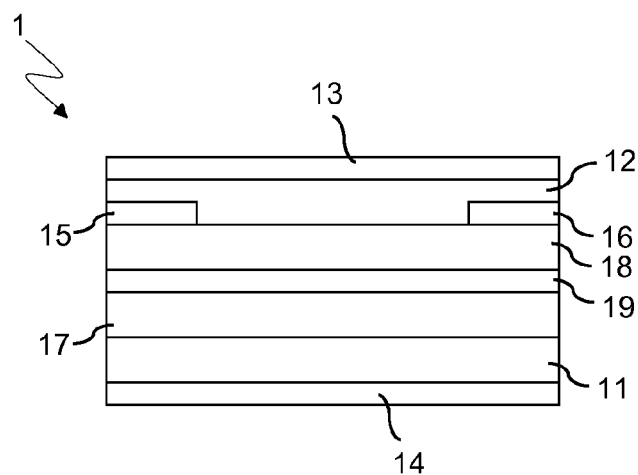

With reference to FIGS. 1a and 1b, it is shown that the electroluminescent organic transistor 1 according to a first embodiment of the invention comprises a first dielectric layer 11, a second dielectric layer 12, a first control electrode 14 and a second control electrode 13.

The transistor according to the present embodiment of the invention further comprises an assembly, positioned between said first dielectric layer 11 and said second dielectric layer 12, which is formed of a source electrode 15, a drain electrode 16 and an ambipolar channel.

Said first dielectric layer 11 is positioned between the first control electrode 14 and said assembly; in the same way, the second dielectric layer 12 is positioned between said second control electrode 13 and said assembly. In other words, the two control electrodes 13 and 14 are positioned outside of the device and in contact respectively with the two dielectric layers 12 and 11, which in turn enclose the assembly formed of the ambipolar channel and the source 15 and drain 16 electrodes.

The materials of the first dielectric layer 11 and the second dielectric layer 12 can be selected among the conventional dielectric materials for electroluminescent organic transistors. In particular, a material or a combination of materials selected from the group consisting of silicon dioxide, polymethyl methacrylate (PMMA), zinc oxide, alumina, zirconium oxide, hafnium dioxide, fluoropolymers, as for example the commercial product Cytop™, polyvinyl alcohol (PVA) and polystyrene (PS) can be used. Preferably, said first dielectric layer 11 comprises two layers of zirconium oxide and polymethyl methacrylate and said layer 12 consists of polymethylmethacrylate or Cytop™.

The materials of the first control electrode 14 and the second control electrode 13 may be selected in the group consisting of indium tin oxide (ITO), gold, copper, silver, aluminum. In particular, indium oxide and tin and/or gold can be used.

The source 15 and drain 16 electrodes may be selected among indium tin oxide (ITO), gold, copper, silver, aluminum, calcium, magnesium, chromium, iron and poly(3,4-ethylenedioxythiophene) coupled with poly(styrenesulfonate) (PEDOT: PSS) or combination of said materials Preferably, as a material for said source electrode 15, aluminum, calcium, magnesium, or gold can be used.

Preferably, as a material for said drain electrode 16, gold or indium tin oxide (ITO) can be used.

According to the invention, the ambipolar channel comprises a first layer of semiconductor material 17, a second layer of semiconductor material 18 and a layer of emissive material 19 arranged between said first layer of semiconductor material 17 and said second layer of semiconductor material 18.

The semiconductor materials for said layers 17 and 18 may be selected from the group consisting of oligoacenes, oligothiophenes and oligofluorenes, pyrimidine derivatives of oligothiophenes, tetrathiophenes substituted at the $\alpha$ and $\omega$ positions with alkyl chains, di-imide derivatives of perylenes and oligothiophenes, pyrimidine derivatives of oligothiophenes, oligothiophene having a thiazole core, coronene derivatives and of tetrathiophene derivatives substituted at the $\alpha$ and $\omega$ positions with perfluorinated chains. In a particularly advantageous way, tetrathiophenes substituted at $\alpha$ and $\omega$ the positions with alkyl chains are used for layer 17, and tetrathiophene derivatives substituted at the $\alpha$ and $\omega$ positions with perfluorinated chains are used for layer 18.

As a material for the emissive layer 19, host-guest type systems of with aluminum quinoline matrix variously doped with, for example, 4-(dicyanomethylene)-2-methyl-6-(p-dimethylaminostyryl)-4H-pyran, platinum octaethyl porphyrin, acetylacetonate iridium phenylisoquinoline can be advantageously used.

The thicknesses of the first layer 17 and of the second layer of semiconductor material 18 are between 5 nm and 50 nm. Preferably, these thicknesses are between 5 nm and 20 nm.

The layer of emissive material 19 has a thickness between 10 nm and 100 nm. Preferably, this thickness is between 10 and 40 nm.

Within the assembly, said source electrode 15 and said drain electrode 16 are both in contact with said first layer of semiconductor material 17 or with said second layer of semiconductor material 18.

According to a preferred embodiment of the invention, said source electrode 15 and said drain electrode 16 are positioned both above, or both below, the layer of semiconductor material with which they are in contact. According to a further embodiment of the invention, said source electrode 15 and said drain electrode 16 have the same thickness of the layer of semiconductor material with which they are in contact and are coplanar with respect to it. In any case, therefore, said source electrode 15 and said drain electrode 16 both lie on a plane parallel to a plane of said first layer of semiconductor material or said second layer of semiconductor material.

Figure 2A:
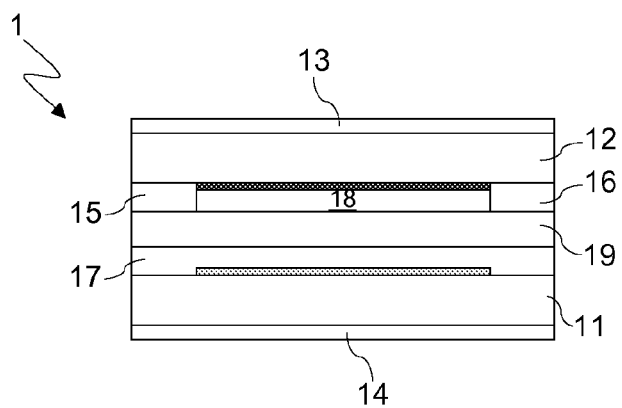
FIGS. 2a and 2b show the schematic sectional view of the transistor according respectively to the first and second embodiments of FIG. 1a and FIG. 1b, in which ideal accumulations of charges in a direct mode driving are shown.
Figure 2B:
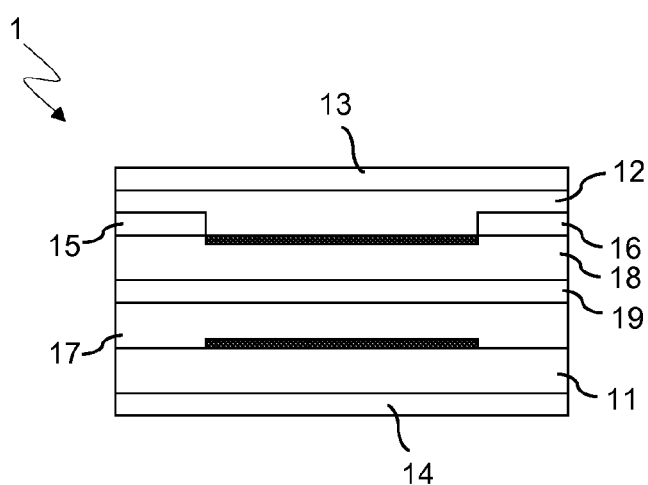

According to an aspect of the present invention, it is provided a driving method of the electroluminescent organic transistor in which the accumulation of the charges and the transport of the same takes place at the interface between the semiconductor materials of the layers 17 and 18 and the dielectric layers 11 and 12, as shown in FIG. 2. This driving method provides that the voltage applied to the control electrode 13 induces the accumulation of charge in the layer of semiconductor material 18 at the interface with the dielectric layer 12 and that the voltage applied to the control electrode 14 induces the accumulation of charge in the layer of semiconductor material 17 at the interface with the dielectric layer 11. By way of example, this can be achieved by applying to the control electrode 13 a value of negative voltage, which induces an accumulation of positive charge in the layer of p-type semiconductor material 18 at the interface with the dielectric layer 12 and applying at the same time to the control electrode 14 a value of positive voltage which induces an accumulation of negative charge in the layer of n-type semiconductor material 17 at the interface with the dielectric layer 11.

Figure 3A:
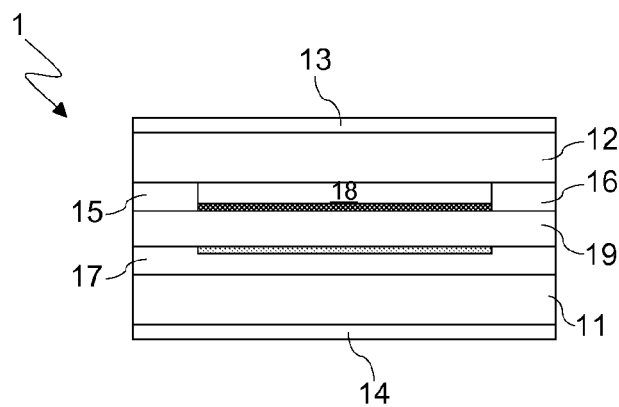
FIGS. 3a and 3b show the schematic view in section of the transistor according respectively to the first and second embodiments of FIGS. 1a and 1b, in which ideal accumulations of charges in an reverse mode driving are shown.
Figure 3B:
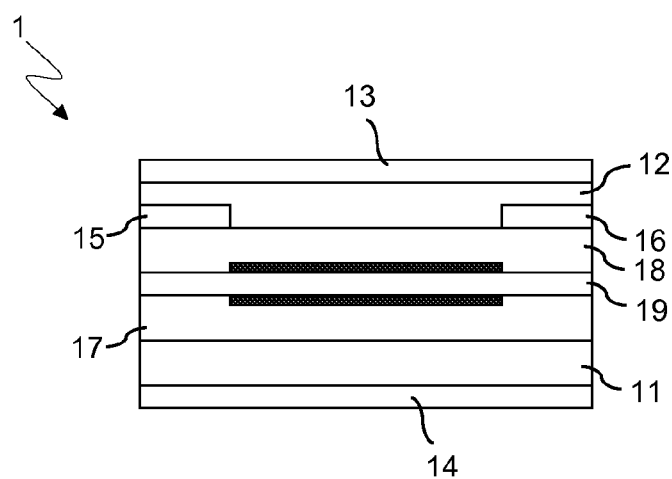

According to a further aspect of the present invention it is provided a driving method of the electroluminescent organic transistor in which the accumulation of the charges and the transport of the same takes place at the interface between the semiconductor materials of the layers 17 and 18 and the emissive layer 19, as shown in FIG. 3. This driving method provides that the voltage applied to the control electrode 13 induces the accumulation of charge in the layer of semiconductor material 17 at the interface with the emissive layer 19 and that the voltage applied to the control electrode 14 induces the accumulation of charge in the layer of semiconductor material 18 at the interface with the emissive layer 19. By way of example, this can be achieved by applying to the control electrode 13 a value of positive voltage which induces the accumulation of negative charge in the layer of n-type semiconductor material 17 at the interface with the emissive layer 19 and applying at the same time to control electrode 14 a value of negative voltage that causes accumulation of positive charge in the layer of p-type semiconductor material 18 at the interface with the emissive layer 19.

The electroluminescent organic transistor according to the present invention can be produced using methods known for the manufacture of multilayer organic transistors. Preferably, the organic electroluminescent transistor can be realized by employing techniques of vacuum evaporation and/or solution deposition techniques and/or sputtering techniques of organic materials, metals and conductive and insulating oxides.

Possible modifications and/or additions may be made by those skilled in the art to the hereinabove disclosed and illustrated embodiment while remaining within the scope of the following claims.

The invention claimed is:

1. An organic electroluminescent transistor, comprising:
a first dielectric layer and a second dielectric layer;
a first control electrode and a second control electrode; and
an assembly comprising:
a source electrode,
a drain electrode, and
an ambipolar channel,
wherein:
said assembly is arranged between said first dielectric layer and said second dielectric layer,
said first dielectric layer is arranged between said first control electrode and said assembly,
said second dielectric layer is arranged between said second control electrode and said assembly,
said ambipolar channel comprises a first layer of a semiconductor material, a second layer of a semiconductor material and a layer of an emissive material arranged between said first layer of semiconductor material and said second layer of semiconductor material,
said first layer of semiconductor material optimizes conduction of a first type of charge carrier,
said second layer of semiconductor material optimizes conduction of a second type of charge carrier, said second type of charge carrier having an opposite charge to said first type of charge carrier;
said source electrode and said drain electrode are formed upon a same one of the layers of said ambipolar channel in correspondence of a horizontal contact surface, and
said source electrode and said drain electrode are both in physical contact with said second layer of semiconductor material and said second dielectric layer while being physically separated from said first layer of semiconductor material and said layer of the emissive material.

2. The organic electroluminescent transistor according to claim 1, wherein both said source electrode and said drain electrode lie on a plane parallel to a plane on which said first layer of a semiconductor material.

3. The organic electroluminescent transistor according to claim 1, wherein a thickness of said first layer of semiconductor material and the thickness of said second layer of semiconductor material are between 5 nm and 50 nm.

4. The organic electroluminescent transistor according to claim 3 wherein the thickness of said first layer of semiconductor material and the thickness of said second layer of semiconductor material are between 5 nm and 20 nm.

5. The organic electroluminescent transistor according to claim 1, wherein said layer of the emissive material has a thickness between 10 nm and 100 nm.

6. The organic electroluminescent transistor according to claim 5, wherein said layer of the emissive material has a thickness between 10 nm and 40 nm.

* * * * *